(12) United States Patent
Lehee et al.

(10) Patent No.: US 10,858,242 B2
(45) Date of Patent: Dec. 8, 2020

(54) MEMS OR NEMS DEVICE WITH STACKED STOP ELEMENT

(71) Applicants: SAFRAN, Paris (FR); COMMISSARIAT A L'ENERGIE ATOMIQUE ET AUX ENERGIES ALTERNATIVES, Paris (FR)

(72) Inventors: Guillaume Jerome Francois Lehee, Moissy-Cramayel (FR); Philippe Serge Claude Onfroy, Moissy-Cramayel (FR); Mikael Colin, Grenoble (FR)

(73) Assignees: SAFRAN, Paris (FR); COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/487,753

(22) PCT Filed: Apr. 20, 2018

(86) PCT No.: PCT/FR2018/000095
§ 371 (c)(1),
(2) Date: Aug. 21, 2019

(87) PCT Pub. No.: WO2018/154196
PCT Pub. Date: Aug. 30, 2018

(65) Prior Publication Data
US 2019/0389722 A1     Dec. 26, 2019

(30) Foreign Application Priority Data
Feb. 23, 2017   (FR) ...................................... 17 51433

(51) Int. Cl.
*B81B 3/00*     (2006.01)
*B82B 1/00*     (2006.01)

(52) U.S. Cl.
CPC ............ *B81B 3/0051* (2013.01); *B82B 1/006* (2013.01); *B81B 2201/0228* (2013.01);
(Continued)

(58) Field of Classification Search
CPC .................. B82B 1/006; B81B 3/0051; B81B 2201/0228; B81B 2201/033; B81B 2203/0136; B81B 2203/04
(Continued)

(56) References Cited

U.S. PATENT DOCUMENTS

2006/0032310 A1*  2/2006  Merassi ................ G01P 15/125
                                                        73/514.35
2007/0193355 A1*  8/2007  Axelrod ................ G01P 15/125
                                                        73/514.32
(Continued)

*Primary Examiner* — Igwe U Anya
(74) *Attorney, Agent, or Firm* — Womble Bond Dickinson (US) LLP

(57) ABSTRACT

The invention relates to a sensor-type or actuator-type MEMS or NEMS device provided with a stacked stop element comprising —a first flat layer having a first flat electrode intended to be at a first electric potential and a second flat electrode intended to be at a second electric potential different from the first potential, said first flat electrode being movable relative to the second flat electrode in a first direction parallel to the first flat layer, —a second flat layer placed on top of the first flat layer and electrically insulated from the first flat layer by at least one intermediate layer made of an insulating material, the second flat layer comprising a first flat element that is mechanically secured to the first flat electrode, and a second flat element that is mechanically secured to the second flat electrode, characterized in that it further comprises at least one stop element extending from the first flat element or the second flat element in the first direction and projecting from said flat element in the first direction, the stop element extending from one of the flat elements being intended to be at the (Continued)

same potential as an opposite surface belonging to the other flat element, and the stop element and the electrodes further being designed for the stop element to come into contact with the opposite surface and to stop the two flat electrodes from moving towards each other in the first direction when under stress.

10 Claims, 10 Drawing Sheets

(52) U.S. Cl.
 CPC . *B81B 2201/033* (2013.01); *B81B 2203/0136* (2013.01); *B81B 2203/04* (2013.01)
(58) Field of Classification Search
 USPC .......................................................... 257/415
 See application file for complete search history.

(56) References Cited

U.S. PATENT DOCUMENTS

| 2008/0282802 | A1* | 11/2008 | Pike ......................... | G01P 15/08 |
|---|---|---|---|---|
| | | | | 73/514.32 |
| 2015/0075284 | A1* | 3/2015 | Che .......................... | B32B 38/10 |
| | | | | 73/514.32 |
| 2017/0305738 | A1* | 10/2017 | Chang ................... | B81B 3/0005 |
| 2019/0187170 | A1* | 6/2019 | Painter ................. | G01P 15/0802 |

* cited by examiner

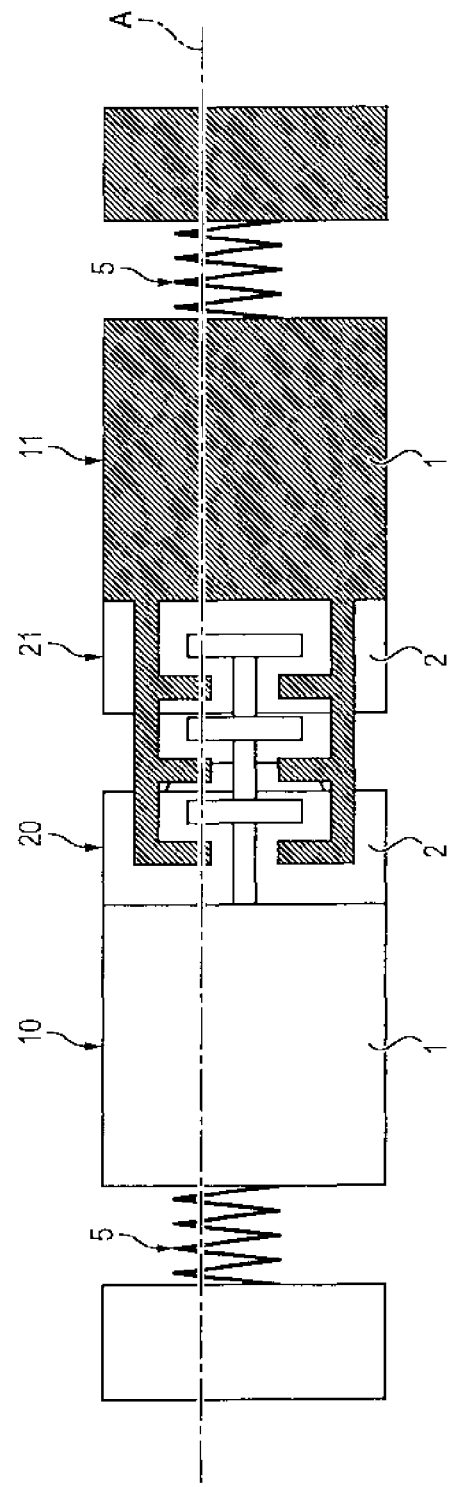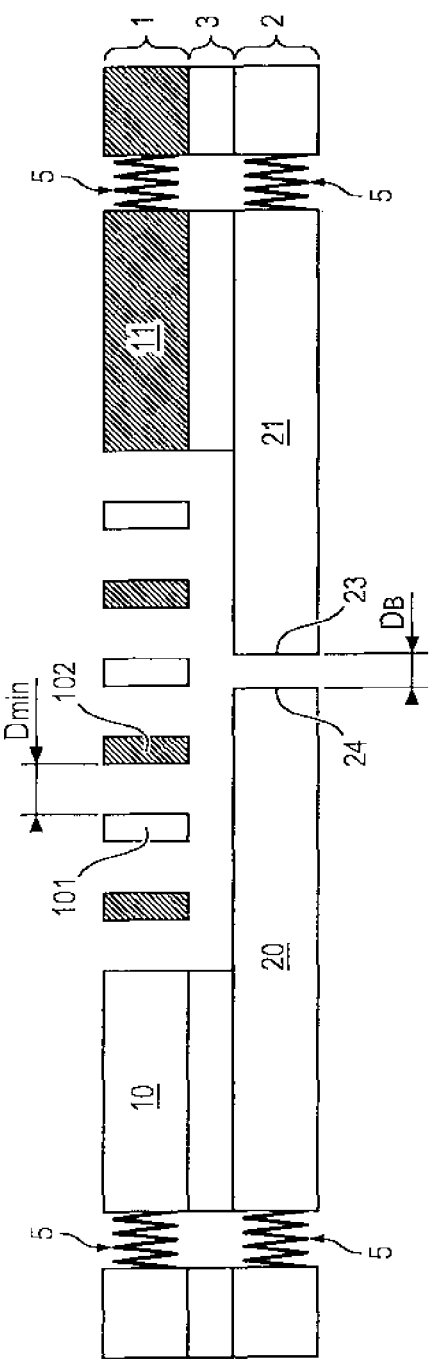

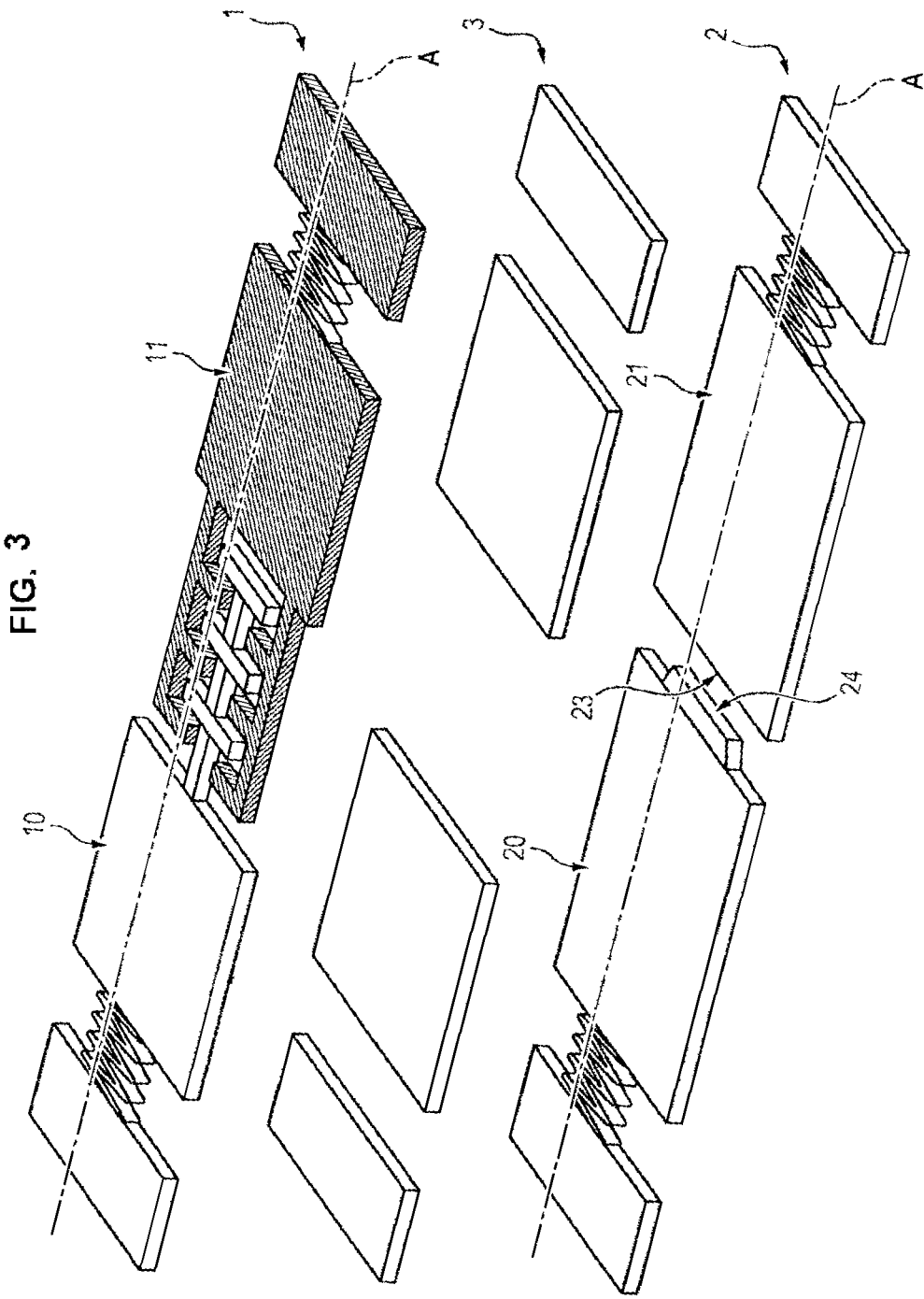

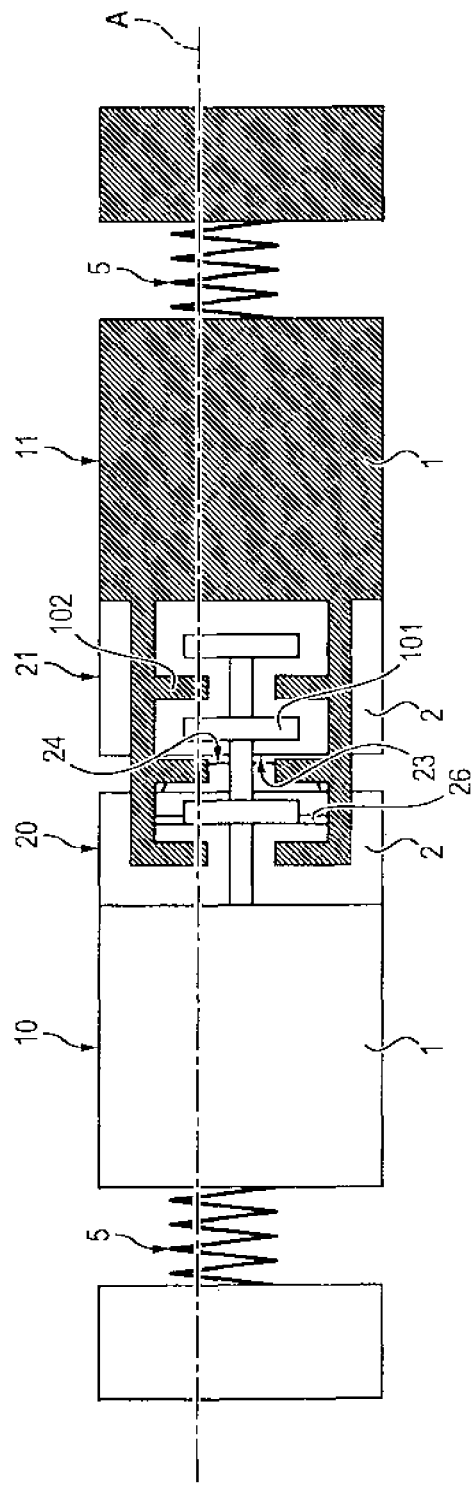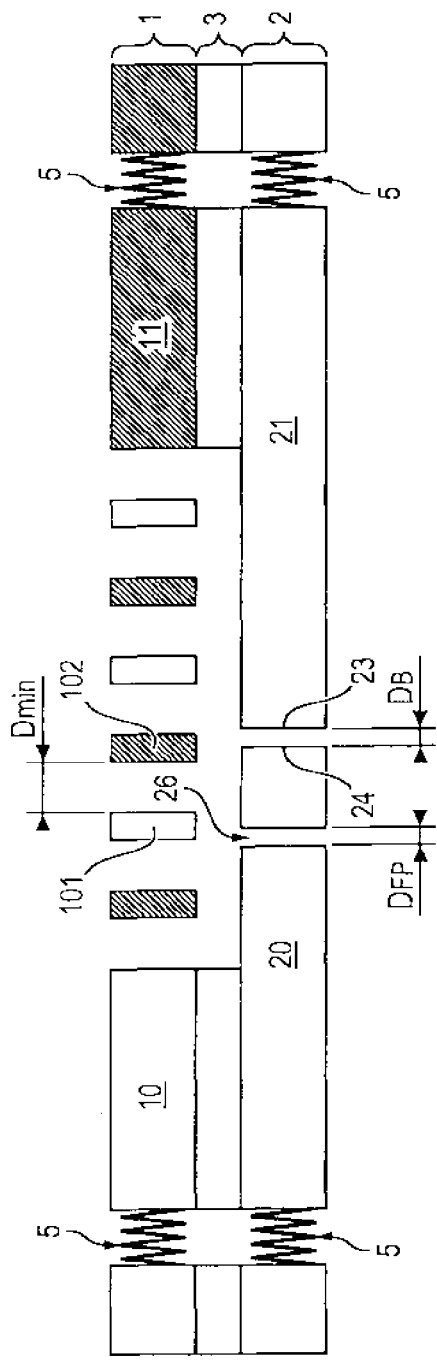

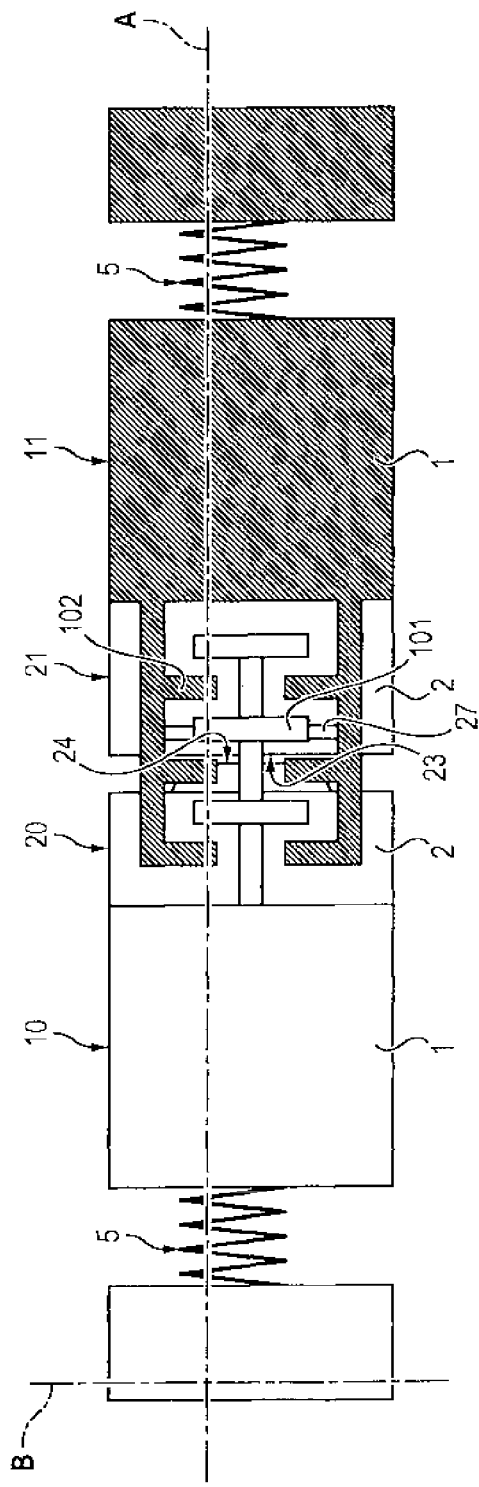
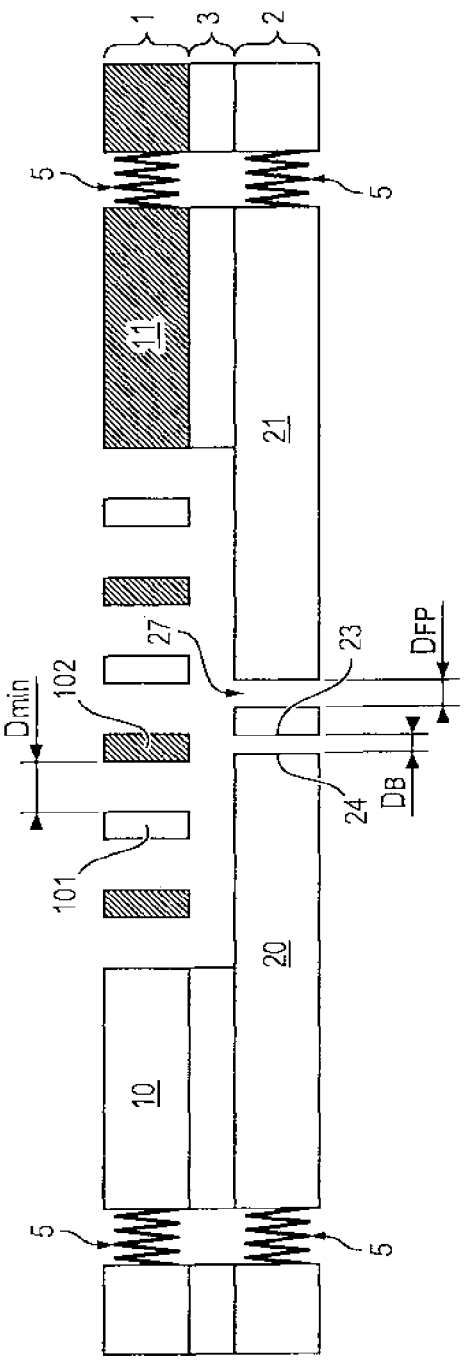

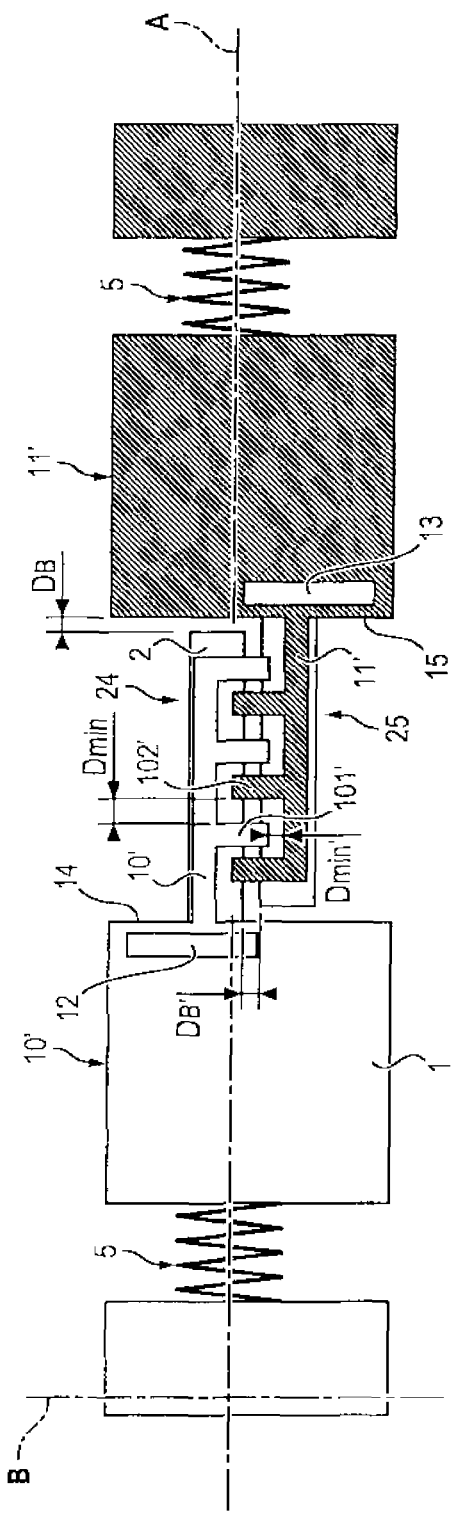

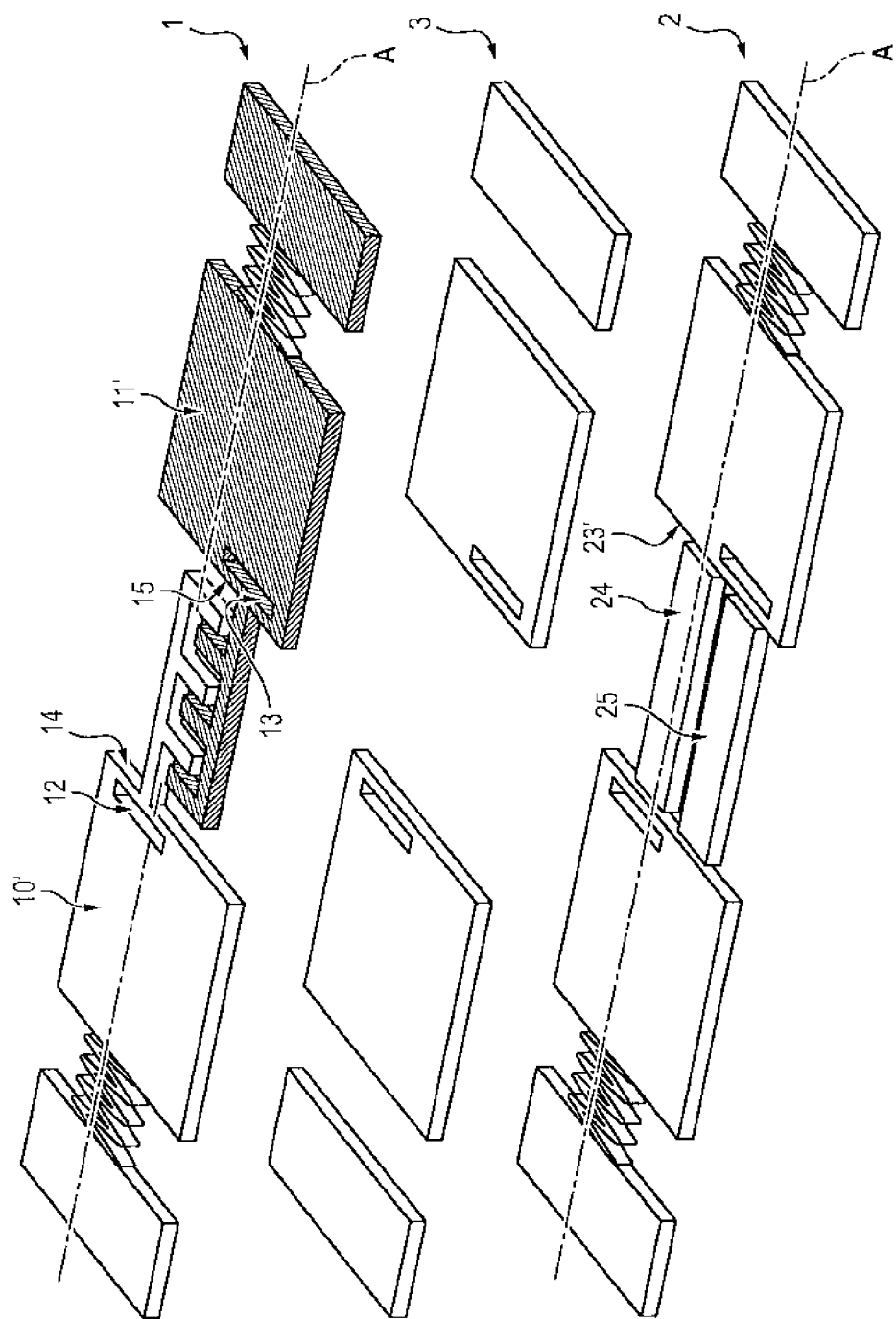

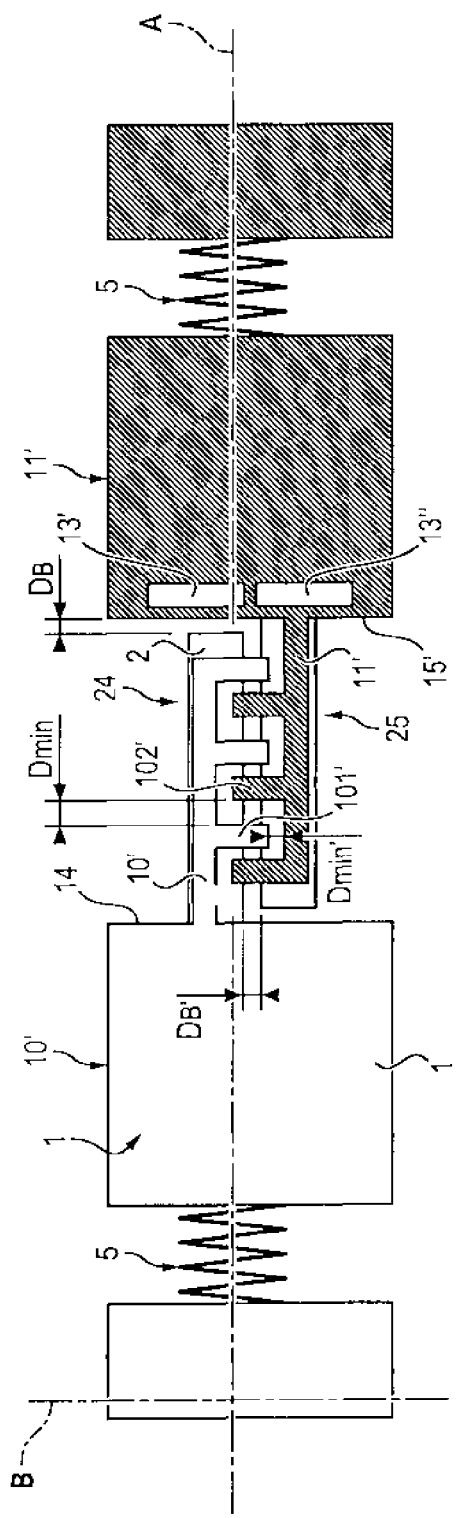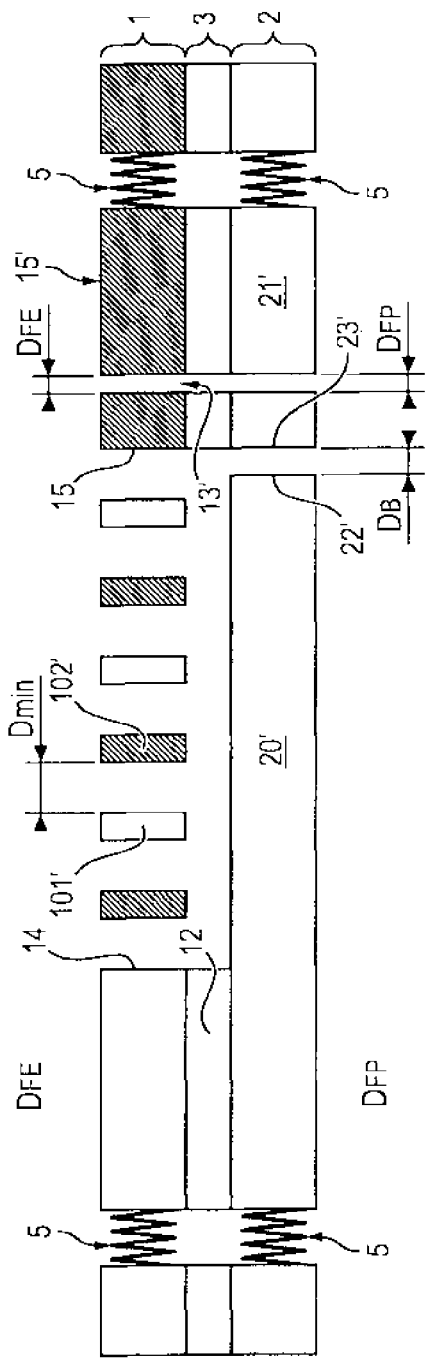

MEMS OR NEMS DEVICE WITH STACKED STOP ELEMENT

TECHNICAL FIELD OF THE INVENTION AND PRIOR ART

The present invention pertains to the technical field of electromechanical devices, MEMS in particular (Micro Electro-Mechanical Systems) or NEMS (Nano Electro-Mechanical Systems), especially those comprising movable elements of millimetric, micrometric even nanometric size and electrically polarized, such as electrostatic sensors or actuators.

Frequent use is made of attraction or repelling forces, particularly electrostatic interactions, to obtain an electrical function e.g. actuation or detection, within MEMS devices. Simple forms of electrostatic actuators comprising two electrodes having at least one planar region and facing each other, to which a different voltage is applied, are known per se. It is also known to use interdigitated combs as electrodes in said actuators, for example to cover larger amplitude of movement.

One of the chief failure modes of MEMS or NEMS electromechanical devices is stiction of the movable elements, particularly through Van der Waals forces or via electrostatic interaction of differently polarized movable elements. One failure mode to be avoided is micro-arcing: an electric arc may occur when differently polarized movable elements are polarized by high potential levels (typically several tens of volts) and/or when the elements lie a small distance apart (typically in the region of a micrometre or less). In addition, these movable elements and neighbouring elements may deteriorate under severe and/or repeated shock.

To overcome these problems, one known solution for two such planar movable elements arranged on the same plane, is to provide robust, rigid or mechanically flexible stop elements in the region where said movable elements are likely to come into contact. Adhesion forces, which are dependent on contact surface, are thereby limited.

However, the contacting of a stop having a certain polarity with an element of different polarity may generate a through current and electrostatic discharge, which could compromise the operating function of the actuator and even cause irreversible damage thereto. The risk of micro-arcing is not fully prevented. It was therefore proposed to isolate said stop electrically from the movable element from which it projects so that the contacting thereof with the opposing element (abutment) does not carry a risk of electrostatic stiction or electrostatic discharge.

Patent application US 2015/0033849 A1 describes a device able to be implemented in an inertial MEMS sensor, comprising a movable planar mass and opposing parallel sense plate. The movable mass and sense plate are placed at different electrical potentials. To prevent electrostatic discharge at acceleration or shock events setting the movable mass in movement, the sense plate carries stop elements oriented in a direction substantially perpendicular to the plane of the sense plate. Said stop elements are electrically isolated from the sense plate and placed at the same potential as that of the opposing movable mass. However, this solution is only pertinent if the relative movement of the movable elements takes place out-of-plane, with one component in the direction perpendicular to the planar movable elements (vertical, in this example) possibly producing contact between two movable elements with risk of electrostatic discharge.

GENERAL DESCRIPTION OF THE INVENTION

The present invention proposes a suitable solution for two coplanar planar electrodes positioned on one same layer in a MEMS or NEMS device, movable relative to one another in at least one first direction of movement within the plane of the electrodes, the electrodes being intended to be placed at different potentials.

The solution of the invention ensures the operating mechanical strength of these two elements movable in relation to each other, whilst preserving their electromechanical functioning after a vibratory or shock event causing in-plane movement thereof.

In addition to a first planar layer comprising two elements, of which at least one is movable, and differently polarized (typically electrodes) together ensuring the required electromechanical operating function, it is proposed to implement an additional layer electrically isolated from the first layer and comprising elements movable in relation to each other, mechanically attached to the two elements of the first layer, able to be set in movement in their plane and to abut each other.

The invention sets out to prevent direct contact between two differently polarized elements for which it is desired to maintain their function, and even to prevent said elements from being sufficiently close to generate a micro-arcing phenomenon. On this account, the mechanical and electrical resistance of said elements is ensured even in the event of a vibratory or shock event, and even if said elements are composed of fragile materials.

The risks related to electrostatic interactions are thereby limited with implementation that is simple and reliable, adapted to a device of micrometric or nanometric size, in the interests of miniaturizing said device.

The invention therefore concerns a MEMS or NEMS device of sensor or actuator type comprising a stack having a first planar layer comprising two planar electrodes intended to be placed at different electrical potentials, the first electrode being movable in-plane relative to the second electrode in a first direction parallel to the first planar layer, and a second planar layer superimposed over the first and electrically isolated from the first layer by at least one intermediate layer formed of insulating material, the second planar layer comprising a first planar element mechanically attached to the first planar electrode and a second planar element mechanically attached to the second planar electrode.

The second layer also comprises a stop element projecting from either one of these two planar elements in the first above-named direction, this stop element being intended to have the same electrical potential as an opposing surface belonging to the other of the planar elements. The stop is able to come into contact with said surface of the opposing planar element and to block the two planar electrodes of the first planar layer from moving towards each other in the first direction when under stress, to prevent them from coming too close.

Advantageously but not limited thereto, in non-stressed state e.g. ex-factory, the stack is arranged so that if the free travel distance of the stop is considered between the stop element and the opposing planar element in the first above-mentioned direction of movement of the electrodes, said free travel distance is shorter than the minimum distance between any free end of the first planar electrode and a closest end of the second planar electrode, taken along this same first direction.

The stop element, during an event inducing relative movement of the two electrodes in this same first direction, is then able to interrupt said relative movement of the two electrodes before the first electrode is placed in contact with the second.

Optionally, at least one of the planar electrodes of the first layer is chosen to be at least partly deformable in the first direction. An electrode deflection distance is then defined as the maximum deformation of the deformable electrode in this same direction, or the sum of the maximum deformations of the two electrodes if both electrodes are chosen to be deformable in the first direction. The minimum distance between the electrodes is then taken to be greater than the sum of the electrode deflection distance and the first free travel distance of the electrodes.

Optionally, and whether or not in addition to the deformability of the electrodes, at least one of the planar elements of the second layer is chosen to be at least partly deformable in the first direction. A planar element deflection distance is then defined as the maximum deformation of said planar element (e.g. of the stop if said planar element carries a stop) in this same direction, or the sum of the maximum deformations of the two planar elements if both planar elements are chosen to be deformable in the first direction. The minimum distance between the electrodes is then taken to be greater than the sum of the planar element deflection distance and the first free travel distance of the electrodes.

In one particular implementation, in which one of the two planar elements is partly deformable in the first direction, the second planar layer is pierced with a cavity (blind i.e. not passing through the entire stack) made at the stop anchor. In another implementation, which may or may not be accumulated with the first, the second planar layer is pierced with a non-through cavity along the outer edge of the abutment (surface opposite the stop). In both implementations, the deflection distance of the planar elements is the sum of the dimensions of both cavities, or the dimension of the single cavity if only one cavity is made.

In another implementation, in which the first planar element carries a first stop element (e.g. in beam form) and the second planar element carries a second similar stop element, both planar electrodes and both planar elements are deformable in the first direction. Deformability is obtained with two through cavities which pass through the stack,
a first being made at the anchor of the first stop, corresponding in the first direction with the first stop but not with the second stop, forming a first flexible strip,
a second being made at the anchor of the second stop, corresponding in the first direction with the second stop but not with the first stop, forming a second flexible strip.

The first free travel distance is then defined as the minimum distance between one of the stops and the abutment. The electrode deflection distance is therefore the sum of the dimensions of the two through cavities.

In one variant of this last implementation, in which the same first and second stop elements are maintained,
a first through cavity is made in the first planar electrode, corresponding in the first direction with one end of the second stop, forming a first flexible strip,
and a second through cavity is made again in the first planar electrode, at the anchor of the first stop element, corresponding in the first direction with the first stop. The two through cavities are therefore made side by side to form two juxtaposed flexible strips.

The first free travel distance is then defined as the minimum distance between one of the stops and the opposing surface in the second layer.

Optionally, for example in connection with the two last above-cited implementations, the two electrodes are also movable relative to each other in a second direction substantially perpendicular to the first direction, the second direction being parallel to the layers of the stack. The first planar element comprises a first stop and the second planar element comprises a second stop. The stack is then configured so that in non-stressed state any free end of the first planar electrode, in relation to the second planar electrode, lies at a minimum distance greater than a second free travel distance which corresponds to the second direction, the second free travel distance being taken to be the minimum distance between the two stops in the second direction.

Advantageously, but not limited thereto, one electrode comprises a planar plate.

Advantageously, but not limited thereto, one electrode comprises an electrostatic comb.

DESCRIPTION OF THE FIGURES

Other characteristics, objectives and advantages of the present invention will become better apparent from the particular embodiments described below, and from the following drawings which are to be interpreted as solely illustrative and nonlimiting.

FIG. 1 is a schematic view of a stop stack in a first embodiment in which the stacking plane of the electrodes stacking is seen from overhead.

FIG. 2 reproduces the device illustrated in FIG. 1 in cross-section along a plane perpendicular to the stacking plane, the cross-sectional plane being indicated by line A.

FIG. 3 reproduces the device illustrated in FIG. 1 seen from overhead in a perspective, exploded view.

FIG. 4 is a schematic view of a stop stack in a variant of the first embodiment, in which the stacking plane of the electrodes is seen from overhead.

FIG. 5 reproduces the device illustrated in FIG. 4, in cross-section along a plane perpendicular to the stacking plane, the cross-sectional plane being indicated by line A.

FIG. 7 is a schematic view of a stop stack in another variant of the first embodiment, giving an overhead view of the stacking plane of the electrodes.

FIG. 8 reproduces the device illustrated in FIG. 7 in cross-section along a plane perpendicular to the stacking plane, the cross-sectional plane being indicated by line A.

FIG. 10 is a schematic view of a stop stack in a second embodiment, in which the stacking plane of the electrodes is seen from overhead.

FIG. 11 reproduces the device illustrated in FIG. 10 in a cross-sectional view along a plane perpendicular to the stacking plane, the cross-sectional plane being indicated by line A.

FIG. 12 reproduces the device illustrated in FIG. 10 in an overhead, exploded perspective view.

FIG. 13 is a schematic view of a stop stack in a variant of the second embodiment, showing an overhead view of the stacking plane of the electrodes.

FIG. 14 reproduces the device illustrated in FIG. 13, in a cross-sectional view along a plane perpendicular to the stacking plane, the cross-sectional plane being indicated by line A.

DETAILED DESCRIPTION OF EMBODIMENTS

Figure 6:
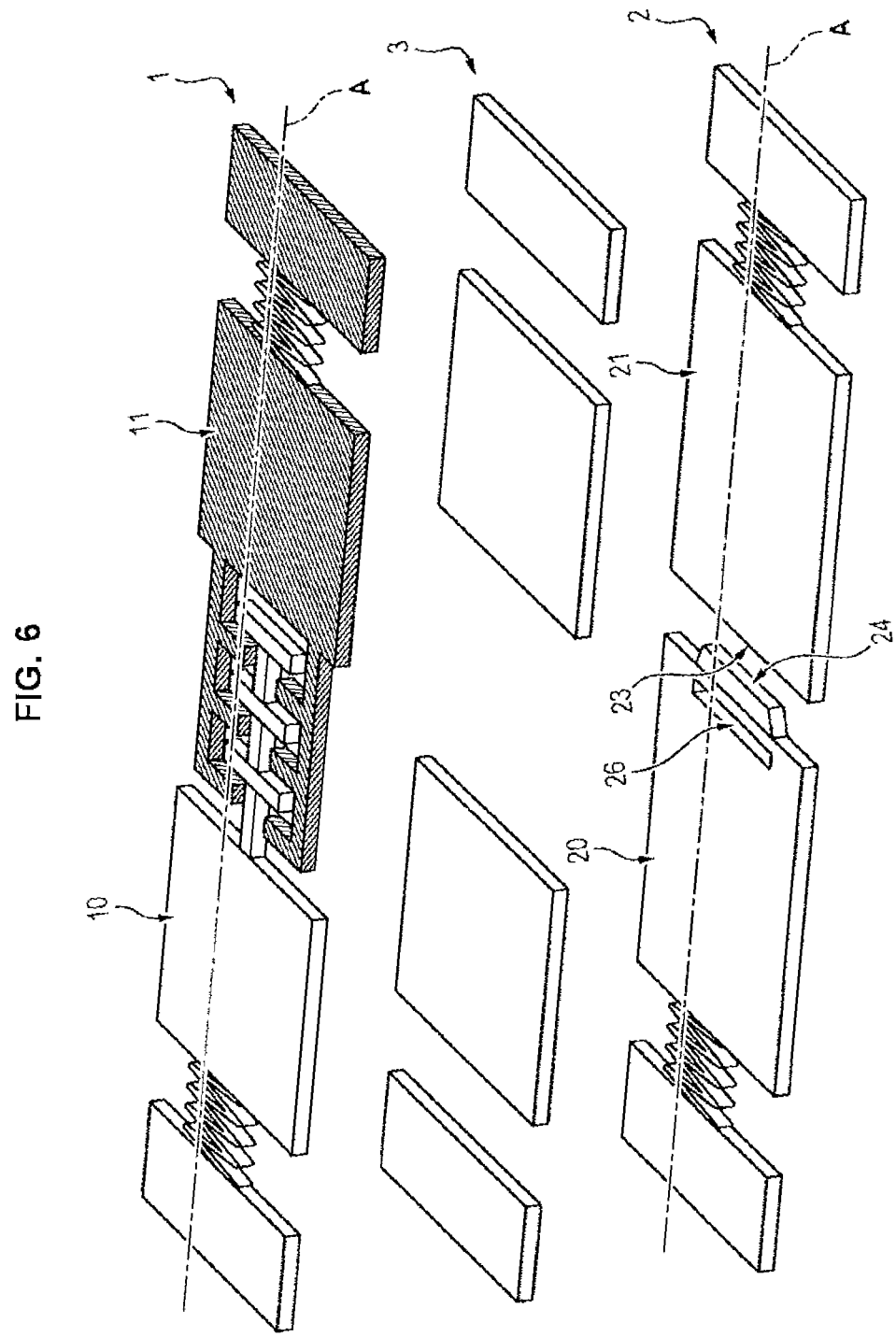
FIG. 6 reproduces the device illustrated in FIG. 4 in an overhead, exploded perspective view.

FIGS. 1 to 3 illustrate a first embodiment of a layered stop stack in a MEMS or NEMS device.

An overhead view of the stack is given in FIG. 1 along a line of vision perpendicular to the stack. It is seen from the side in FIG. 2 in cross-section along a plane perpendicular to the stacking plane represented by the dotted line A in FIG. 1 and by the two dotted lines A in FIG. 3. Finally, an overhead, exploded perspective view is given in FIG. 3 indicating two directions parallel to direction A to represent the cross-section of FIG. 2.

On a first overlying layer 1, a left electrode 10 comprises a planar left portion in a single piece and a right portion forming an electrostatic comb attached to the left portion. The left electrode 10 is considered movable solely in a first direction represented by line A. Opposite the left electrode 10 there is a right electrode 11 of similar design with a planar right portion in a single piece and a left portion forming two symmetrical lateral electrostatic combs able to enter into electrostatic interaction with the comb of electrode 10. The right electrode 11 here is considered to be fixed.

For this first embodiment, when mention is made of movement of electrode 10 or relative movement of both electrodes 10 and 11, only movement along this first direction represented by line A will be considered. Both electrodes 10 and 11 are made of silicon for example. In this embodiment they are considered to be non-deformable in direction A.

The left electrode has different polarization from the right electrode so that contacting between any of the ends of electrode 10 and any of the ends of electrode 11 could lead to short-circuiting and/or electrostatic discharge, possibly causing irreversible damage the stop stack, even to the control/read electronics subsequent to a generated short-circuit. Also, risks of failure exist even if the electrodes 10 and 11 are not placed in direct contact but are drawn together over a short distance (in the region of one micrometre) sufficient to create a disruptive field in air and cause a micro-arcing phenomenon.

A layer 3 forms an intermediate electrically isolating layer. This layer is positioned underneath layer 1 and can only be seen in FIGS. 2 and 3. In this layer a left planar insulating surface has been placed underneath the left planar portion of electrode 10, and a right planar insulating surface underneath the right planar portion of electrode 11. The central part of layer 1, comprising alternating teeth of the comb of electrode 10 and the comb of electrode 11, is left without an underlying insulating element in layer 3.

Underneath layer 3 there is arranged a semiconductor layer 2. It is this sublayer 2 which comprises a stop element. A left planar movable element 20 is arranged to correspond with the left electrode 10. Here the planar movable element 20 is of same width, in a direction perpendicular to direction A, as electrode 10. The movable element 20 extends over a longer distance towards the right in FIG. 1, towards opposing electrode 11, than the right edge of the left planar portion of electrode 10. Therefore, the movable element 20 extends towards the right as far as a stop element 24, attached to movable element 20, forming the right outer edge thereof. The stop element 24 does not necessarily extend over the entire width of the movable element 20 and electrode 10.

The stop 24 therefore projects outside the movable element 20 in direction A. Here, the stop 24 lies directly below the electrode 10 and in particular below the comb projecting from said electrode. However, alternatively, the stop 24 could project from the movable element 20 at a position not lying underneath the comb. For example, the stop 24 could be positioned underneath the solid left portion of electrode 10. Another important property of the system is that the movable element 20 is mechanically attached to electrode 10, in particular in its translational movement in direction A. In their translational movement in this direction, the movable element 20 and electrode 10 are held by suspension means 5 implemented in the first layer 1 and in the second layer 2 (but not in the insulating layer 3). These suspension means 5 enable electrode 10 and planar element 20 to translate whilst remaining mechanically attached, in relation to a fixed portion of the MEMS device positioned behind the suspension means 5.

The left planar insulating surface of layer 3 therefore affords the mechanical attaching of electrode 10 with the movable element 20. It also creates electrical isolation between electrode 10 and the movable element 20 to ensure that the electrical potentials of elements 10 and 20 are independent at every position of the assembly formed by elements 10 and 20 in direction A.

In layer 2, opposite the movable element 20 and in particular the stop element 24, there is arranged a right planar movable element 21 vertically corresponding with the right electrode 11. In similar manner to the left movable element 20, the movable element 21 via its left edge 23 extends over a longer distance towards the left, towards electrode 10, than the right planar portion of the right electrode 11. The movable element 21 is attached to electrode 11 in particular when in translational movement in direction A. The right planar insulating surface of layer 3 is also preferably attached to electrode 11 and movable element 21.

The left edge 23 therefore faces the stop element 24, at a distance $D_B$ from the stop element 24 in direction A, the distance $D_B$ here being a first free travel distance.

The first free travel distance $D_B$ corresponds to the maximum amplitude of movement in the first direction A of the stop 24 in relation to the movable element 23 (and hence of the left electrode 10 in relation to the right electrode 11). In the event of a shock causing movement of the movable element 20 relative to element 21 and of electrode 10 relative to electrode 11, the stop element 24 interrupts the drawing together of these elements in direction A by coming to abut the right edge 23, to ensure that electrode 10 in this state of maximum closeness does not lie at a distance from electrode 11 shorter than a distance D2. Distance $D_2$ of maximum closeness between the electrodes takes into account the risk that a micro-arcing phenomenon may occur between the neighbouring ends of the two electrodes 10 and 11. This distance $D_2$ is dependent on implementation, in particular on the potential levels used for electrodes 10 and 11. It is typically in the region of one micrometre. This distance $D_2$ cannot be seen in FIGS. 1 to 3. The minimum distance $D_{min}$ between electrodes 10 and 11 in non-stressed state (hence when not in the state of maximum closeness) is therefore taken to be greater than the sum of the first free travel distance $D_B$ in the first direction A, and of distance $D_2$ dependent on implementation conditions. This distance $D_{min}$ between the electrodes 10 and 11 in direction A, in this example, is the distance between the right edge of tooth 101 of the comb of electrode 10 and the left edge of tooth 102 of the comb of electrode 11, references 101 and 102 being shown in FIG. 2 of the present application. Since the electrodes may comprise conventional electrostatic combs of small size for example, it may be necessary to provide a very short free travel distance, typically of about 5 microns.

Of additional importance is the contact between the stop element 24 and the left edge 23 of the right movable element 21 which must not carry the same risks of short-circuiting, electrostatic discharge or electrostatic stiction as the contacting between two free ends of electrodes 10 and 11 e.g. ends 101 and 102. In the example given here, all the elements of the sublayer 2 are polarized in the same manner. The intermediate insulating layer 3 ensures independence between the electrical potentials of the elements of layer 1 and the electrical potentials of the elements of layer 2, although dependencies do exist between the positions in direction A of some of these elements.

FIGS. 4 to 6 illustrate a first variant of the first embodiment shown in FIGS. 1 to 3. As in FIGS. 1 to 3: an overhead view of the stack is given in FIG. 4, a side view along a line of vision perpendicular to the stack in FIG. 5, in cross-section along a plane perpendicular to the stacking plane represented by the dotted line A, in an overhead, exploded perspective view in FIG. 6.

The implementation of layers 1, 2 and 3, of the electrodes 10 and 11, and of the corresponding planar elements 20 and 21, is similar to that shown in FIGS. 1 to 3. The implementation of the stop 24 projecting from the planar element 20 is also similar with the exception that the stop is made flexible compared with the preceding embodiment. Here, a cavity 26 is made at the anchor of the stop element 24 slightly offset from the right outer edge of the planar element 20. The cavity 26 is not formed over the entire width of the planar element 20 but it must be formed over a width strictly larger than that of the stop element 24, to ensure the mobility of the stop 24 relative to the planar element 20 in direction A. The cavity 26, either side of the stop 24, therefore forms two free embedded strips. The stop 24 is not deformable in a direction perpendicular to direction A (vertical in the Figure), since it is held by the two free embedded strips either side of the stop 24. The abutment (surface 23 opposite the stop 24), remains non-deformable in direction A. It is to be noted that the flexible stop here 24 is formed by two free embedded strips, but could be implemented in any other known manner for electromechanical devices (chevron . . . )

The two planar elements 20 and 21, together with the electrodes 10 and 11 mechanically attached to said planar elements, are able to draw towards each other in response to stress, held by the suspension means 5. If their closeness is sufficient, the stop 24 can enter into contact with the opposing surface 23, and the planar elements 20 and 21 can then still draw close under the effect of the movement to the left of the flexible strip, the cavity 26 then being closed. The cavity 26 is only formed in the second planar layer, since the first planar layer is not solid in the zone positioned vertically above the cavity 26 (zone of the electrostatic combs of the electrodes). The cavity 26 has a dimension in direction A which corresponds to a planar element deflection distance $D_{FP}$, such as illustrated in FIG. 5, corresponding to the maximum deformation of planar element 20 in direction A.

Therefore, in response to stress, the electrodes 10 and 11 and in particular tooth 101 of the comb of electrode 10 and tooth 102 of the comb of electrode 11, are able to draw together over a maximum distance $D_B$ (first free travel distance) to which is added the planar element deflection distance $D_{FP}$. The sizing of the stack, in this variant of the first embodiment, is designed so that the minimum distance $D_{min}$ in non-stressed state between electrodes 10 and 11 in direction A, for example here the distance between teeth 101 and 102, is greater than the sum of distances $D_B$ and $D_{FP}$. It is thereby ensured that even in the event of stress generating movement towards each other of electrodes 10 and 11, the teeth 101 and 102 are not able to touch one another. Consideration could also be given to a micro-arcing distance $D_2$ below which it is estimated that there is a risk of formation of an electric arc in the thin layer of gas separating teeth 101 and 102. In this case, distance $D_{min}$ should be chosen to be greater than $D_B+D_{FP}+D_2$, so that even in a state in which the two electrodes 10 and 11 are drawn together, failure related to micro-arcing is prevented.

Figure 9:
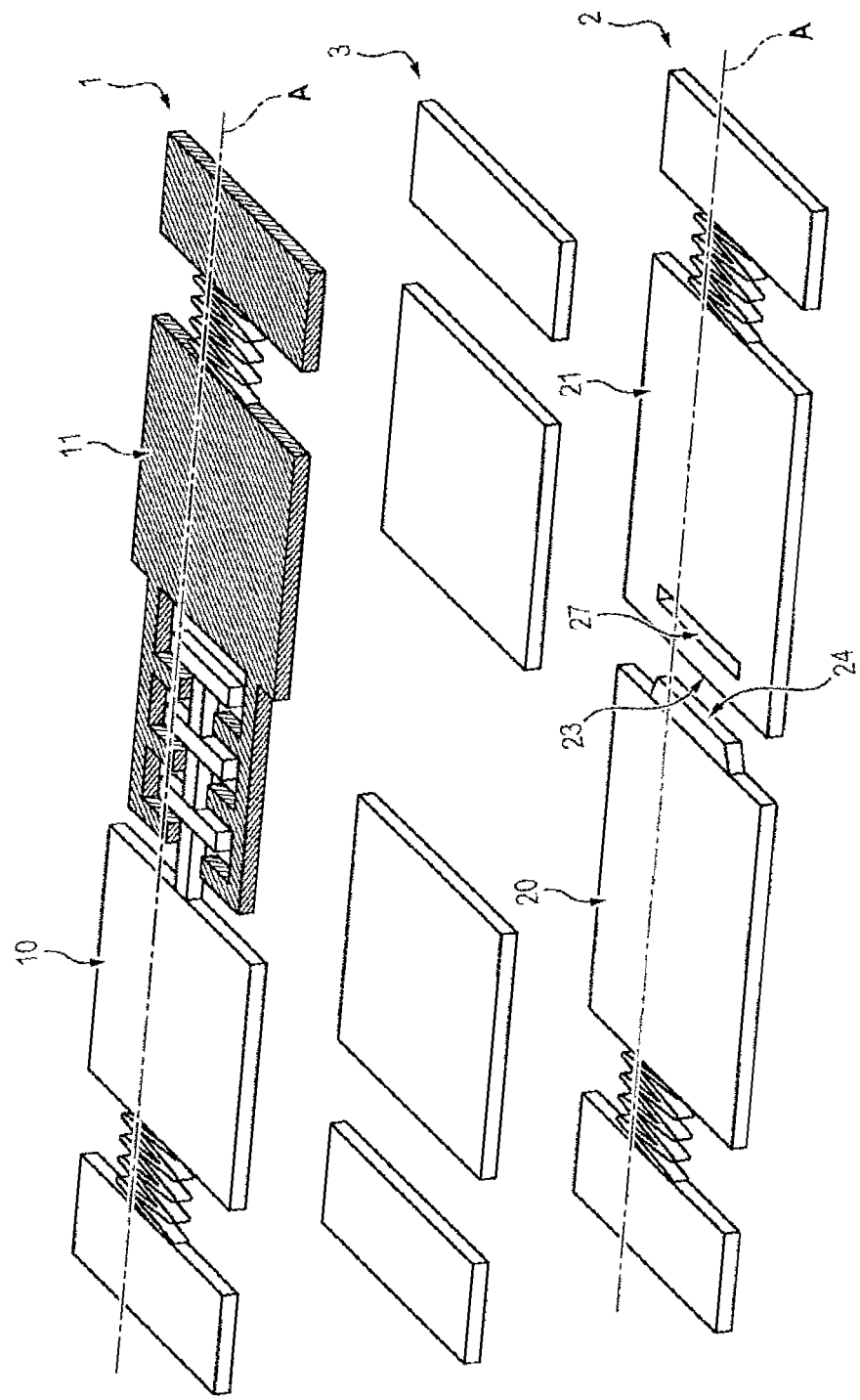
FIG. 9 reproduces the device illustrated in FIG. 7 seen from overhead in a perspective, exploded view.

FIGS. 7 to 9 illustrate a second variant of the first embodiment shown in FIGS. 1 to 3. As in FIGS. 1 to 3: an overhead view of the stack is given in FIG. 7, a side view along a line of vision perpendicular to the stack in FIG. 8, in cross-section along a plane perpendicular to the stacking plane represented by the dotted line A, in an overhead, exploded perspective view in FIG. 9.

In this variant, the form of the electrodes of layer 1 and of the stop 24 is similar to that described in connection with FIGS. 1 to 3.

Similar to the first variant described above, a flexible strip is provided in layer 2 to induce partial deformability in the first direction A. However, unlike the first variant described in FIGS. 4 to 6, no cavity is made at the anchor of the stop 24. Here a cavity 27 is made in planar element 21 in the region facing the stop 24 (i.e. in the region of the abutment). With slight offset from the left outer edge of the movable planar element 21, an elongate cavity is formed over a width in the direction perpendicular to direction A which is smaller than the total width of the planar element 21 but greater than the width of the stop element 24, so as to form a flexible bi-embedded strip, that portion of the planar element 21 positioned on the left of the cavity 27 being deformable in the first direction A. The flexible strip thus formed is not deformable in a direction perpendicular to direction A (vertical in the Figure), since it is held by the edges of the cavity 27. The stop 24 remains non-deformable in direction A.

The two planar elements 20 and 21, together with the electrodes 10 and 11 (mechanically attached to said planar elements) here too are able draw close to each other in response to stress, held by the suspension means 5. If closeness is sufficient the stop 24 can enter into contact with the opposing surface 23, after which the planar elements 20 and 21 can still draw close under the effect of movement towards the right of the flexible strip, the cavity 27 then being closed. The cavity 27 here too is still only formed in the second layer 2 and has a dimension corresponding to a planar element deflection distance $D_{FP}$, such as illustrated in FIG. 5. This planar element deflection distance represents the maximum deformation of the planar element 21 in direction A.

Therefore, in response to stress the electrodes 10 and 11, and in particular tooth 101 of the comb of electrode 10 and tooth 102 of the comb of electrode 11, are able to draw together over a maximum distance $D_B$ (first free travel distance) to which is added the planar element deflection distance $D_{FP}$. The minimum distance $D_{min}$ in non-stressed state between the electrodes 10 and 11 in direction A, obtained for example between the teeth 101 and 102, is greater than the sum of distances $D_B$ and $D_{FP}$. If optionally it is desired to take into account risks of failure related to micro-arcing, it is possible to define a minimum distance $D_2$ between the ends of the electrodes below which said risk exists. The stack would then be sized to obtain $D_{min}$ greater than the SUM $D_B+D_{FP} D_2$.

FIGS. 10 to 12 illustrate a second embodiment of a layered stack, in which the implementation of the electrodes and stops differs from all the previously described Figures. Here electrodes 10' and 11' are illustrated.

The stack is seen from above in FIG. 10, along a line of vision perpendicular to the stack. It is seen in a side view in FIG. 11 in cross-section along a plane perpendicular to the stacking plane represented by the dotted line A in FIG. 10 and by the two dotted lines A in FIG. 12. Finally, an overhead exploded perspective view is given in FIG. 12 indicating two directions parallel to direction A to represent the cross-section given FIG. 11.

The number references used in FIGS. 1 to 3 and defined above can be reused in FIGS. 10 to 12 to designate corresponding elements in the stack according to the second embodiment.

This second embodiment differs in particular from the first embodiment in that the electrodes 10' and 11' of layer 1 and the corresponding planar elements 20 and 21 are chosen to be partly deformable in the first direction A. An advantageous embodiment is proposed here so that the electrostatic combs of the electrodes seen in FIGS. 10 to 12 are movable in direction A relative to the remainder of their carrier electrodes.

In addition, this second embodiment also differs from the first embodiment in that the electrodes 10' and 11', and in particular the electrostatic combs, are movable relative to one another in a second direction B perpendicular to direction A, contained in the plane of the electrodes 10' and 11'. For example, suspension means not illustrated in the Figures e.g. similar to suspension means 5, can allow the mobility of the electrodes 10' and 11' in direction B.

The left electrode 10' of layer 1 here comprises a left planar portion and an electrostatic comb on a right portion. Symmetrically, the right electrode 11' comprises a right planar portion and an electrostatic comb on a left portion. The two electrostatic combs respectively corresponding to electrodes 10' and 11' are arranged such that, in non-stressed state, their teeth interdigitate without touching each other, and in particular without touching each other in the first direction A or in the second direction B.

The left electrode 10' differs from the left electrode 10 in the preceding embodiment in that its left planar portion is pierced with a through cavity 12 of rectangular shape. It is said to be a through cavity in that it is made through the entire thickness of the stack in the three layers 1, 2 and 3. This embodiment therefore differs largely from the embodiments corresponding to FIGS. 4 to 9 in which a cavity is only made in the lower layer 2, the electrodes 10 and 11 therefore being non-deformable in direction A. The through cavity 12 is made in the vicinity of the right outer edge 14 of the left planar portion of electrode 10', but slightly offset from the edge 14. This cavity enables the outer edge 14 to form a flexible strip. The flexible strip is able to react to a vibratory event undergone by electrode 10' by moving in translation in direction A, over a maximum amplitude which corresponds to an electrode deflection distance $D_{FE}$, and to a planar element deflection distance $D_{FP}$ (since both a portion of electrode 10' and a portion of the planar element 20 are deformable at the flexible strip). When the flexible trip 14 moves in said translation, the material of the portion of electrode 10' forming an electrostatic comb not being deformable in direction A, the electrostatic comb is also able to move in translation in direction A over an amplitude which does not exceed the electrode deflection distance $D_{FE}$. The flexible strip 14 is not deformable in direction B, since it is held by the edges of the through cavity 12.

In fully similar manner, the right electrode 11' on the left outer edge of the right planar portion thereof, is provided with a through cavity 13 which gives rise to a flexible strip 15. The flexible strip 15, similar to flexible strip 14, is deformable in translation in direction A, over a maximum amplitude equal to the electrode deflection distance $D_{FE}$.

The distance $D_{min}$ between electrodes 10' and 11' in direction A, in this second example, is obtained between the right edge of tooth 101' of the comb of electrode 10' and the left edge of tooth 102' of the comb of electrode 11', the references 101' and 102' being shown in FIG. 11. Since the electrodes 10' and 11' have different polarization as in the preceding example, it is essential that they should not be in contact, failing which there is a risk they could compromise the electromechanical functioning of the system. It could possibly be considered that it is not sufficient to prevent the electrodes coming into contact, but that in addition the ends thereof should not be allowed to come too close (distance of about one micrometre for example) to prevent micro-arcing phenomena. The intermediate layer 2 here ensures an electrical isolation role similar to the role it plays in the preceding example. Finally, layer 3 similar to the preceding example comprises a stop element which ensures that the electrodes 10' and 11' are not likely to come into contact during a vibratory or shock event which could set the electrodes 10' and 11' in movement relative to one another in the first direction A.

The sublayer 2 here is shown with an arrangement differing from the preceding example. The sublayer 2 still comprises a left planar element 20' attached to electrode 10' and a right planar element 21' attached to electrode 11', such that the planar elements 20' and 21' are movable relative to each other in the first direction A.

Unlike the left planar element 20 illustrated in FIGS. 1 to 3, the left planar element 20' in this example changes width in the vicinity of the outer edge 14 of electrode 10'. It has a branch 24 forming a stop element extending as far as a right end 22' of the stop element. Contrary to the preceding example, the stop element 24 does not lie in central position in the region between the left planar element and the right planar element in sublayer 2, but is positioned on the right edge of the branch 24 which is slightly offset from the opposing edge 23 of the right planar element 21'.

As can be seen in FIG. 10, the stop element 24 and in particular the end 22' thereof, lies in the continuity of the through cavity 12 in the first direction A, but not in the continuity of the through cavity 13, so that facing the end 22' there is a non-deformable portion of the right element 21'. In addition, the width of the through cavity 12 (in direction B) is larger than that of the stop 24. Therefore, the anchor of the stop 24 corresponds to a flexible strip in direction A, but its end part 22' does not lie opposite a flexible strip.

Symmetrically, the right element 21' has a stop element 25 extending from the edge vertically corresponding to the outer edge 15 of electrode 11', and in the continuity of the through cavity 13, and has a stop element end part facing a non-deformable edge of the left element 20'. The stop stack in the second embodiment therefore comprises two stop elements 24 and 25.

The distance between the stop element 24 and the edge 23' of the opposing right planar element 21', or between the stop element 25 and the edge of the opposing left planar element 20', corresponds to a first free travel distance $D_B$, having the same meaning as the first free travel distance $D_B$ in the preceding example. It will also be noted here that the electrode deflection distance $D_{FE}$ (maximum total deformation at the electrodes) which is the deflection distance attributable to cavities 12 and 13 in layer 1, and the planar element deflection distance $D_{FP}$ (maximum total deformation at the stop elements), which is the deflection distance attributable to cavities 12 and 13 in layer 2, are equal. The through cavities 12 and 13 have constant dimensions throughout the entire thickness of the stack: the anchor of the electrostatic combs is deformable in direction A over the same length as the anchor of the stops.

Importantly, the first free travel distance $D_B$ which corresponds to the maximum amplitude of movement in the first direction A of end 22' relative to the opposing element 23' (and hence of the left electrode 10' relative to the right electrode 11'), is such that the sum of this free travel distance and the maximum amplitude of deformation (electrode deflection distance $D_{FE}$) of the two electrodes 10' and 11' in relation to each other, is shorter than the minimum distance in direction A between the left electrode 10' and right electrode 11'.

Therefore, when the two electrodes 10' and 11' are drawn together under the effect of an internal force (electrostatic force) or external force (acceleration, shock), the teeth of the electrostatic combs (e.g. teeth 101' and 102') are first drawn towards each other over a distance which corresponds to the free travel of the stop elements 24 and 25. Then, if the drawing together continues, the base of the stop element 24, under the bearing effect of end 22' opposite the stop 24, may press against the flexible strip 14 positioned at the anchor of the stop 24, and induce deflection of the teeth of the comb of 10'.

The dimensioning criterion applied here is therefore more restrictive than in the preceding example, since when sizing the minimum distance between the two electrodes 10' and 11' in the first direction A, consideration is given not only to the first free travel distance of the electrodes 10' and 11' allowable by the arrangement of the stop 24, but also to the maximum amplitude of relative deformation of the two electrostatic combs respectively projecting from the electrodes 10' and 11'. Therefore, the distance $D_{min}$ between the two electrodes 10' and 11' in the first direction A, represented here between tooth 101' of the comb of electrode 10' and tooth 102' of the comb of electrode 11', must be greater than $D_{FE}+D_B$. If it is desired to take into account risks of micro-arcing between the teeth of the electrostatic combs of electrodes 10' and 11', a minimum distance $D_2$ can be defined between the electrode ends, below which this risk exists. In this case the stack could be sized so that $D_{min}$ is greater than the sum $D_B+D_{FP} D_2$.

One effect of this dimensioning, in the event of shock causing movement of the movable element 20' relative to element 21' and of electrode 10' relative to electrode 11', is to allow the stop element 24 to interrupt the drawing together in direction A of these elements, by coming to abut the right edge 23', before electrode 10' is able to come sufficiently close to electrode 11' to generate an electrostatic discharge or electric micro-arcing, thus damaging the MEMS device.

Also, as mentioned above, the electrodes 10' and 11' are movable relative to each other not only in the first direction A, but also in the second direction B here taken to be perpendicular to the first direction A. The two stop elements 24 and 25, the form and positioning thereof relative to the planar elements 20' et 21' having been described above, lie distant from each other in this second direction B, forming a second free travel distance $D_B'$ in direction B.

The stack is then arranged so that in the non-stressed state, the first electrode 10' lies at a distance $D_{min}'$ from the second electrode 11' in the second direction B which is greater than this second free travel distance $D_B'$, so that the two electrodes cannot be placed in contact either by moving close in the second direction B.

A second dimensioning criterion $D_{min}'>D_B'$ is therefore taken into account here, in addition to the criterion governing the maximum movement of the electrodes and their dimensioning in the first direction A.

One advantage of this second embodiment with partial deformability of the electrodes is that it can be used in devices likely to undergo large amplitudes of movement opposite the air-gap of the electrodes, subsequent to a shock event. In particular, MEMS intended for high performance applications require air-gaps of small size and large masses, typically inertial sensors, which generate large amplitude of movement after a shock event in relation the air-gap of the electrodes.

Figure 15:
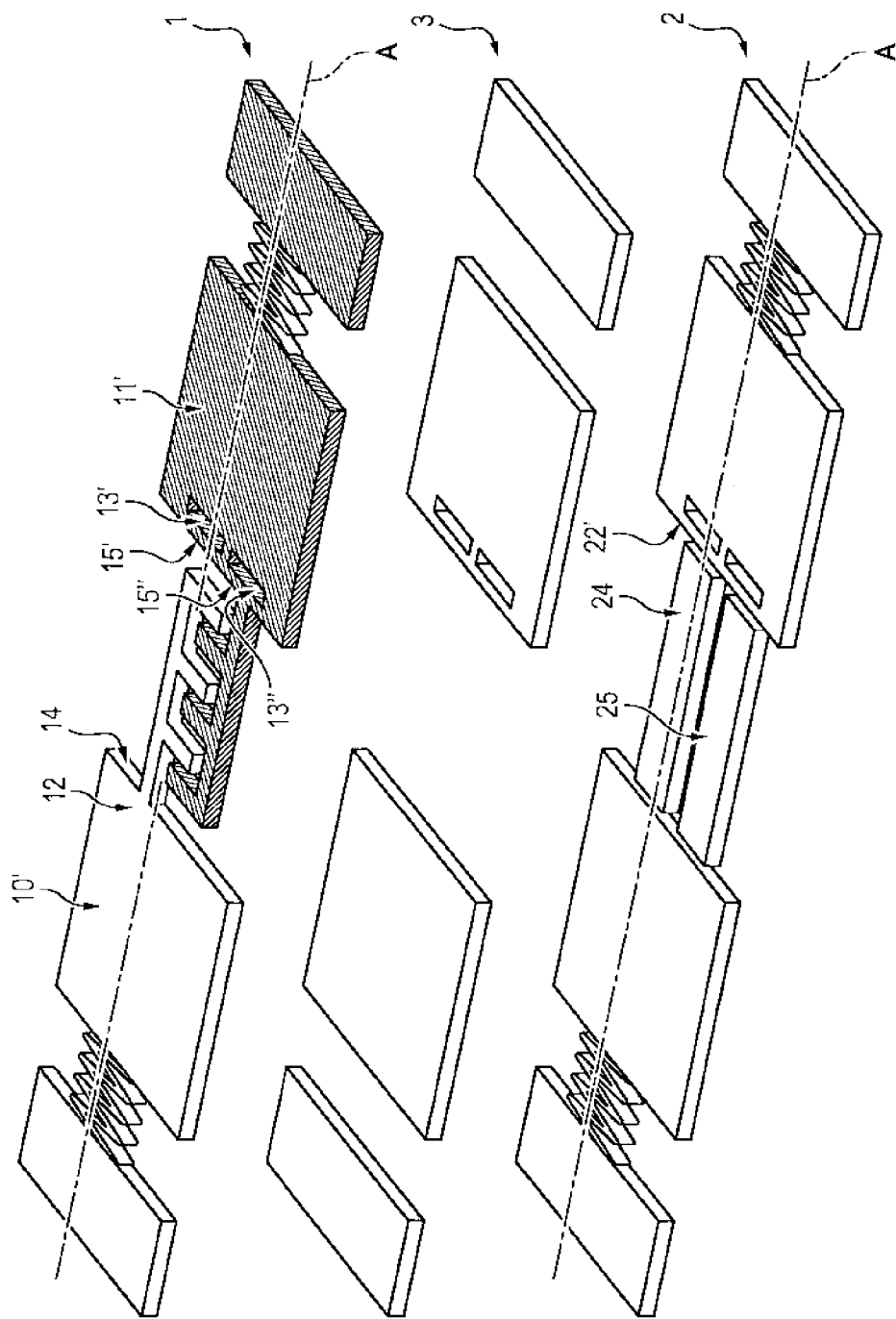
FIG. 15 reproduces the device illustrated in FIG. 13 in an overhead, exploded perspective view.

FIGS. 13 to 15 illustrate a variant of the second embodiment shown in FIGS. 10 to 12.

An overhead view of the stack is given in FIG. 13 along a line of vision perpendicular to the stack. A side view is given in FIG. 14 in cross-section along a plane perpendicular to the stacking plane represented by the dotted line A in FIG. 13 and the two dotted lines A in FIG. 15. Finally, an overhead exploded perspective view is given in FIG. 15 indicating two directions parallel to direction A to represent the cross-section of FIG. 14.

In this variant of the second embodiment, the form of the electrodes in layer 1 is similar to the form described above in connection with FIGS. 10 to 12. The form of the stops 24 and 25 in layer 2 also remains unchanged.

However, in this variant, only electrode 11' is partly deformable in the first direction A, the electrostatic comb of this electrode being movable in direction A relative to its base. Also, the electrodes 10' and 11' remain movable relative to each other in a second direction B perpendicular to direction A, contained in the plane of these electrodes.

Specifically, the through cavity 12 described in connection with FIGS. 10 to 12 made in electrode 10' and in the underlying layers, is no longer provided here. The through cavity 13 of FIGS. 10 to 12 is not present in the variant of FIGS. 13 to 15.

The stack described here comprises two through cavities 13' and 13" made with the same offset from the left outer edge of electrode 11', having a width in direction B greater than that of the ends of the stop elements 24 and 25, so as to form two flexible strips 15' and 15" in the first direction A.

The through cavity 13' is positioned facing end 22' of the stop element 24 (the form of the stop element 24 being identical to that of the second described embodiment). The through cavity 13" is made at the anchor of the stop element 25. Both through cavities 13' and 13", and hence the two flexible strips 15' and 15", are independent and separated by a rigid partition. Also, the elongate stop elements 24 and 25 remain unchanged compared with the above second embodiment.

Therefore, when the two electrodes 10' and 11' are drawn together in the first direction A under the effect of external mechanical stress, the teeth of the electrostatic combs (e.g. teeth 101' and 102') are first drawn together over a distance corresponding to the first free travel distance $D_B$ of the stop elements 24 and 25, as in the first implementation of the second embodiment.

On the other hand, the behaviour of the electrostatic comb teeth differs if the drawing together in the first direction A is continued: the base of the stop element 24 can no longer induce deflection of the teeth of the comb of 10', in the absence of the through cavity 12 of the embodiment in FIGS. 10 to 12.

In its place, the presence of a new through cavity 13' facing the end 22' of the stop element, this cavity being made in the body of the opposing electrode 11', means that the end 22' of the stop 24 is able to press against the flexible strip 15', so that the stop 24 continues its advance towards electrode 11' in the first direction A. Therefore, the teeth of the comb of 10' can be deflected in opposite direction to the direction of deflection obtained with the second embodiment. The deflection obtained in this third embodiment, unlike that obtained in the second embodiment, is not able to draw together the teeth of the electrostatic combs e.g. teeth 101' and 102'.

The dimensioning criterion applied here is therefore less restrictive than in the preceding example. Consideration is given to the first free travel distance of electrodes 10' and 11' allowable by the arrangement of the stops 24 and 25. The distance $D_{min}$ between both electrodes 10' and 11' in the first direction A, represented here between tooth 101' of the comb of electrode 10' and tooth 102' of the comb of electrode 11', must be greater than $D_B$. Optionally, in similar manner to the variants described above, it is possible to take into account the risk of micro-arcing between the electrodes, in which case a minimum distance $D_{min}$ can be taken in the non-stressed state between electrodes 10' and 11' that is greater than the sum of the first free travel distance $D_B$ of the electrodes and a distance $D_2$ below which it is estimated that there is a risk of micro-arcing. In this case, the minimum distance $D_{min}$ between the ends of the electrodes in the non-stressed state is taken to be greater than the sum $D_B+D_2$.

In addition, since the electrodes 10' and 11' here again are movable relative to each other not only in the first direction A, but also in the second direction B, the relative positioning of the two stop elements 24 and 25 in this second direction B is also the subject of an additional dimensioning criterion.

If the second free travel distance between the two stop elements 24 and 25 in this second direction B is again denoted $D_B'$, the stack is arranged so that in the non-stressed state the first electrode 10' lies at a distance $D_{min}'$ from the second electrode 11' in the second direction B which is greater than this second free travel distance $D_B'$.

The second dimensioning criterion $D_{min}'>D_B'$ of the second embodiment is therefore maintained.

It is to be noted that if the illustrative examples described herein depict a layer comprising the electrodes, performing the expected electromechanical functioning of the system, that is stacked above the layer comprising a stop element to prevent physical contact between the electrodes, another arrangement could be envisaged in which the layer comprising the electrodes lies underneath the layer comprising the stop elements.

The invention claimed is:

1. MEMS or NEMS device of sensor or actuator type, provided with a stop stack comprising:
   a first planar layer comprising a first planar electrode intended to be at a first electrical potential and a second planar electrode intended to be at a second electrical potential differing from the first potential,
   the first planar electrode being movable relative to the second planar electrode in a first direction (A) parallel to the first planar layer,
   a second planar layer superimposed over the first planar layer, electrically isolated from the first planar layer by at least one intermediate layer formed of insulating material, the second planar layer comprising a first planar element mechanically attached to the first planar electrode, and a second planar element mechanically attached to the second planar electrode,
   wherein the MEMS or NEMS device further comprises at least one stop element extending from the first planar element or from the second planar element in the first direction (A) and projecting from said planar element in the first direction (A),
   the stop element which extends from one of the planar elements being intended to be at the same potential as an opposing surface belonging to the other of the planar elements,
   the stop element and the electrodes being configured so that the stop element comes into contact with the opposing surface and blocks the two planar electrodes from moving towards each other in the first direction (A) when under stress.

2. The MEMS or NEMS device according to claim 1, wherein the stop element and the electrodes are configured so that in the non-stressed state, any free end of the first planar electrode in relation to a closest end of the second planar electrode in the first direction (A), lies at a minimum distance ($D_{min}$) greater than a first free travel distance ($D_B$), said distance being defined as the minimum distance between the stop element and the opposing surface.

3. The MEMS or NEMS device according to claim 2, wherein the minimum distance ($D_{min}$) is greater than the sum of the first free travel distance ($D_B$) and a second predetermined distance, below which there is a risk of loss of insulating nature of the gas surrounding the electrodes with possible short-circuiting between two ends of the electrodes.

4. The MEMS or NEMS device according to claim 2, wherein at least one first planar electrode is at least partly deformable in the first direction (A), the sum of the maximum possible deformations in the first direction (A) of the electrodes defining an electrode deflection distance ($D_{FE}$), the minimum distance ($D_{min}$) being taken to be greater than the sum of the first free travel distance ($D_B$) and the electrode deflection distance ($D_{FE}$).

5. The MEMS or NEMS device according to claim 4 wherein at least one of said planar elements is at least partly deformable in the first direction (A), the sum of the maximum possible deformations in the first direction (A) of the planar elements defining a given planar element deflection distance ($D_{FP}$), the minimum distance ($D_{min}$) being taken to be greater than the sum of the first free travel distance ($D_B$) and the planar element deflection distance ($D_{FP}$), and wherein the two planar electrodes and the two planar elements are deformable in the first direction, the first planar element carrying a first stop element and the second planar element carrying a second stop element,
   a first through cavity being made through the entire height of the stack at the anchor of the first stop element, corresponding in the first direction (A) with said first stop element, but not corresponding in the first direction (A) with the second stop element, forming a first flexible strip,
   a second through cavity being made through the entire height of the stack at the anchor of the second stop element, corresponding in the first direction (A) with said second stop element, but not corresponding in the first direction (A) with the first stop element, forming a second flexible strip,
   the first free travel distance ($D_B$) being defined as the minimum distance between the first stop element and the opposing surface, the electrode deflection distance ($D_{FE}$) being defined as the sum of the dimensions in the first direction (A) of the two through cavities.

6. The MEMS or NEMS device according to claim 4 wherein at least one of said planar elements is at least partly deformable in the first direction (A), the sum of the maximum possible deformations in the first direction (A) of the planar elements defining a given planar element deflection distance ($D_{FP}$), the minimum distance ($D_{min}$) being taken to be greater than the sum of the first free travel distance ($D_B$) and the planar element deflection distance ($D_{FP}$), and wherein the first planar element carries a first stop element and the second planar element carries a second stop element,
  wherein a first through cavity is made through the entire height of the stack in the first planar electrode, corresponding in the first direction (A) with one end of the opposing second stop element, forming a first flexible strip,
  a second through cavity is made through the entire height of the stack in the first planar electrode, at the anchor of the first stop element in the first direction (A), and corresponding in the first direction (A) with said first stop element, forming a second flexible strip,
  the first free travel distance ($D_B$) being defined as the minimum distance between the first stop element and the opposing surface.

7. The MEMS or NEMS device according to claim 1, wherein at least one first planar element is at least partly deformable in the first direction (A), the sum of the maximum possible deformations in the first direction (A) of the planar elements defining a given planar element deflection distance ($D_{FP}$), the minimum distance ($D_{min}$) being taken to be greater than the sum of the first free travel distance ($D_B$) and the planar element deflection distance ($D_{FP}$).

8. The MEMS or NEMS device according to claim 7, wherein at least one of the two planar elements is partly deformable in the first direction (A),
  the second planar layer being pierced with a cavity made at the anchor of the stop element, and/or being pierced with a cavity made along an outer edge of the opposing surface of the stop element,
  the planar element deflection distance ($D_{FP}$) being defined as the sum of the dimensions in the first direction (A) of the two cavities, or optionally defined as the dimension in the first direction of the single cavity, made in the second planar layer.

9. The MEMS or NEMS device according to claim 1, wherein the two planar electrodes are also movable relative to each other in a second direction (B) substantially perpendicular to the first direction (A),
  the second direction (B) being parallel to the planar layer containing the electrodes,
    and wherein the first planar element carries a first stop element and the second planar element carries a second stop element,
    the MEMS or NEMS device being configured so that, in the non-stressed state, any free end of the first planar electrode in relation to the second planar electrode in the second direction (B), lies at a minimum distance ($D_{min}'$) greater than a second free travel distance ($D_B'$), the second free travel distance ($D_B'$) being defined as the minimum distance between the first and second stop elements in the second direction (B).

10. The MEMS or NEMS device according to claim 1, in which one electrode comprises a planar plate and/or in which one electrode comprises an electrostatic comb.

* * * * *